United States Patent [19]
Sakamoto et al.

[11] Patent Number: 5,327,096
[45] Date of Patent: Jul. 5, 1994

[54] CONTROL CIRCUIT FOR AUTOMATICALLY CONTROLLED FEED FORWARD NONLINEAR DISTORTION COMPENSATION AMPLIFIER

[75] Inventors: Hironori Sakamoto; Akira Ito, both of Mitaka; Toshio Nojima, Yokosuka, all of Japan

[73] Assignees: Japan Radio Co., Ltd.; Nippon Telegraph & Telephone Corporation; NTT Mobile Communication Network Inc., Tokyo, Japan

[21] Appl. No.: 16,244

[22] Filed: Feb. 11, 1993

[30] Foreign Application Priority Data

Feb. 27, 1992 [JP] Japan ............................ 4-041737

[51] Int. Cl.⁵ .............................................. H03F 1/00
[52] U.S. Cl. ................................. 330/151; 330/149; 330/52
[58] Field of Search .................. 330/149, 151, 52; 328/163

[56] References Cited

U.S. PATENT DOCUMENTS

| | | | |
|---|---|---|---|
| 4,885,551 | 12/1989 | Myer | 330/151 |
| 5,157,345 | 10/1992 | Kenington et al. | 330/151 |
| 5,166,634 | 11/1992 | Narahashi et al. | 330/151 |

FOREIGN PATENT DOCUMENTS 2637270 9/1977 Fed. Rep. of Germany .
WO-A-91/16760 10/1991 PCT Int'l Appl. .
2243736 11/1991 United Kingdom .

*Primary Examiner*—James B. Mullins
*Assistant Examiner*—J. Dudek
*Attorney, Agent, or Firm*—Oliff & Berridge

[57] ABSTRACT

A control circuit for an automatically controlled feed forward nonlinear distortion compensation amplifier. The control circuit controls a distortion detection loop and a distortion removal loop. The distortion detection loop is a loop for feeding forward input to a main amplifier into a first directional coupler. The distortion removal loop is a loop for feeding forward distortion elements into a second directional coupler. The main amplifier is preceded by a variable attenuator and a variable phase shifter. A variable attenuator and a variable phase shifter are also located in a feed forward path to the second directional coupler. The control circuit controls the variable attenuator and the variable phase shifter preceding the main amplifier for detecting the distortion elements. The control circuit controls the variable attenuator and the variable phase shifter located in the feed forward path to the second directional coupler for removing the distortion elements. A temperature compensation signal and an adjustment signal are added to a control signal by each adder provided at the output stage of the control circuit.

25 Claims, 4 Drawing Sheets

CONTROL CIRCUIT FOR AUTOMATICALLY CONTROLLED FEED FORWARD NONLINEAR DISTORTION COMPENSATION AMPLIFIER

BACKGROUND OF THE INVENTION

1. Field of the invention

This invention relates to an automatically controlled feed forward nonlinear distortion compensation amplifier (which will be hereinafter referred to as an FF amplifier) and an improvement in a control circuit applied thereto.

2. Description of the related art

An automatically controlled feed forward nonlinear distortion compensation system is one of many techniques for providing amplifiers with very low distortion. An amplifier provided with this system, that is, an FF amplifier, consists of a loop for detecting distortions and a loop for eliminating them.

FIG. 3 shows a configuration example of the conventional FF amplifier wherein a distortion detection loop 10 consists of a divider 12, a variable attenuator 14, a variable phase shifter 16, a main amplifier 18, and a directional coupler 20. A distortion elimination loop 22 consists of a variable attenuator 24, a variable phase shifter 26, an auxiliary amplifier 28, and a directional coupler 30. Further, a control circuit 32 is provided to control the variable attenuators 14 and 24 and the variable phase shifters 16 and 26.

The distortion detection loop 10 operates so as to extract only distortion elements occurring in the main amplifier 18. The distortion elimination loop 22 operates so as to add the distortion elements extracted by the distortion detection loop 10 to the output of the main amplifier 18 but in the opposite phase for eliminating the distortion elements. First, input to the FF amplifier is supplied by the divider 12 to the variable attenuator 14 and the directional coupler 20. The variable attenuator 14 attenuates the input signals from the divider 12 and the variable phase shifter 16 shifts the phase of the signals attenuated by the variable attenuator 14. The main amplifier 18 amplifies the output of the variable phase shifter 16, then outputs the amplified signals via the directional couplers 20 and 30 to an external device. At the same time, the distortion elements produced in the main amplifier 18 are extracted by the directional coupler 20 in response to the output of the main amplifier 18 and the signal supplied from the divider 12 for feeding into the variable attenuator 24. To optimize extraction of the distortion element, "a first optimum operation condition" must be satisfied, as described below.

The variable attenuator 24 attenuates the distortion elements fed from the directional coupler 20 and the variable phase shifter 26 shifts the phase of the attenuated distortion elements. The auxiliary amplifier 28 amplifies the output of the variable phase shifter 26. The output of the auxiliary amplifier 28 is added by the directional coupler 30 to the output of the directional coupler 20. Thus, the distortion elements are added to the signals amplified by the main amplifier 18 in opposite phase, thereby eliminating the distortion elements from the output of the FF amplifier if "a second optimum operation condition" described below is satisfied.

To optimize operation of an FF amplifier having such a configuration, the following two optimum operation conditions must be satisfied: The first optimum operation condition requires that the transfer function of the path denoted by 100 in FIG. 3 be equivalent to the transfer function of the path denoted by 110 except that they have opposite signs and similarly the second requires that the transfer function of the path denoted by 200 in FIG. 3 be equivalent to the transfer function of the path denoted by 210 except that they have opposite signs.

The variable attenuators 14 and 24 and the variable phase shifters 16 and 26 are provided to satisfy these optimum operation conditions. The control circuit 32 is provided to control the attenuators and phase shifters to enable the FF amplifier to always operate under the optimum operation conditions.

For the FF amplifier to make distortion compensation for providing the improvement effect of 30 dB or more, the gain variation and phase variation in each of the loops 10 and 22 must be kept within $\pm 0.3$ dB and $\pm 2°$ respectively. Thus, very flat frequency characteristics are required for the parts making up the FF amplifier. On the other hand, the variable attenuators 14 and 24 and the variable phase shifters 16 and 26 which can cause the amounts of attenuation and phase shift to be continuously changed are required for the FF amplifier to make distortion compensation, configuration examples of the variable attenuators and variable phase shifters being as shown in FIGS. 4 and 5 respectively.

The variable attenuator shown in FIG. 4 is a circuit using a PIN diode 34. For example, signal inputs from the divider 12 and control inputs from the control circuit 32 are applied to the PIN diode 34. The variable phase shifter shown in FIG. 5 is provided with a variable capacitance diode 36 and a circulator 38; the signal inputs are applied to the circulator 38 and the control inputs to the cathode of the variable capacitance diode 36.

As described above, very flat frequency characteristics of gain and phase shift amount are required for the parts making up the FF amplifier. Amplification circuits with semiconductors require some temperature compensation since their characteristics change in response to a temperature change because of the nature of semiconductor material. However, conventional temperature compensation methods have several problems.

The following temperature compensation methods are available: Use of a thermosensitive device to provide a bias circuit for transistors making up an amplification circuit; or location of a temperature compensation circuit separate from an amplification circuit. If complete temperature compensation is enabled by these methods, complete distortion compensation operation will always be performed even when the amounts of attenuation and phase shift cannot be automatically controlled. Resultantly, leading-in operation, when automatic control is started, becomes fast and control operation also becomes stable. However, it is very difficult to decide temperature compensation circuit constants.

As an alternate temperature compensation method, the control ranges in the variable attenuators 14 and 24 and the variable phase shifters 16 and 26 (the ranges of the amounts of attenuation and phase shift that can be controlled) are preset widely and then changes in gains and the phase shift amount are absorbed under the control of the variable attenuators 14 and 24 and the variable phase shifters 16 and 26. This method is preferred to the method using a temperature compensation circuit or the like in that the need for the difficult decision of circuit constants is eliminated; however, distortion compensation operation without controlling gains or phases, that is, in a free running condition is not always placed in the best condition. Therefore, leading-in operation, when automatic control is started, becomes slow and stability of control operation gets worse. When a digital-to-analog converter is used at the output stage of the control circuit 32, if the control range is set widely, resolution per bit is degraded.

The conventional FF amplifier also contains some problems with adjustments. To adjust the FF amplifier for starting distortion elimination operation, if the distortion detection loop and distortion elimination loop are adjusted so that the FF amplifier performs the best distortion compensation operation in a free running condition with no automatic control, then the leading-in operation, when automatic control is started, becomes fast and control operation also becomes stable. For this purpose, however, it is necessary to provide a variable attenuator and a variable phase shifter separate from the variable attenuators 14 and 24 and the variable phase shifters 16 and 26 for automatic control or it is necessary to adjust the gains and phase shift amounts of the main amplifier 18 and the auxiliary amplifier 28.

The method of adding one more variable attenuator and one more variable phase shifter to each loop has a number of disadvantages such as low reliability, an increase in cost, and an increase in transmission loss because of an increase in the number of circuit parts. The method of adjusting the gains and phases of the main amplifier 18 and the auxiliary amplifier 28 contains a problem that it is difficult to make separate adjustments of the gains and phases such as change of only the phase without changing the gain or change of only the gain. Further, a skilled engineer is needed for adjustments because very flat frequency characteristics are required for the FF amplifier as described above.

SUMMARY OF THE INVENTION

Accordingly, it is an object of the invention to provide a control circuit which has a simpler circuit configuration to execute a more stable control operation and enables easy adjustments of an FF amplifier.

Another object of the invention is to provide an FF amplifier using the control circuit.

To these ends, according to the invention, there is provided a control circuit for an automatically controlled feed forward distortion compensation amplifier. The amplifier using the control circuit comprises, for example, the following:
(a) a main amplifier which amplifies an input signal;
(b) means for coupling output of the main amplifier to a first feed forward signal for generating a second feed forward signal;
(c) means for coupling output of the main amplifier to the second feed forward signal for generating an output signal;
(d) first adjustment means responsive to a first amplitude control signal and/or a first phase control signal for adjusting the relationship of amplitude and/or phase between the input signal and the first feed forward signal;
(e) second adjustment means responsive to a second amplitude control signal and/or a second phase control signal for adjusting the relationship of amplitude and/or phase between the output of the main amplifier and the second feed forward signal. The control circuit according to a first configuration of the present invention is a circuit which controls the amplifier having the above-mentioned configuration and comprises the following:
(f) distortion detection control means for generating the first amplitude control signal and/or the first phase control signal so as to make the second feed forward signal a signal substantially containing only the distortion element contained in the output of the main amplifier;
(g) distortion elimination control means for generating the second amplitude control signal and/or the second phase control signal so as to substantially eliminate the distortion element from the output signal; and
(h) adding means for adding an amplitude offset signal and/or a phase offset signal to the first amplitude control signal and/or the first phase control signal.

Therefore, in the control circuit according to the first configuration, the amplitude and/or phase relationship between the input signal and the first feed forward signal changes in response to the value of the first amplitude offset signal and/or the value of the first phase offset signal. The amplitude offset signal and/or the phase offset signal is, for example, a temperature compensation signal of a value corresponding to a temperature change or an adjustment signal set at initial adjustment. In the former case, the amplitude and/or phase relationship between the input signal and the first feed forward signal changes in response to temperature changes; in the latter case, the relationship changes in response to how the initial adjustment is made. These show that the invention enables temperature compensation to be made by an easy technique and simplifies initial adjustment work.

For example, variable attenuators and variable phase shifters are available as actual means that may be used to change the amplitude and/or phase relationship between the input signal and the first feed forward signal. In other words, the first adjustment means described above can be configured so as to contain a variable attenuator and/or a variable phase shifter. The amounts of attenuation and phase shift of the variable attenuator and/or the variable phase shifter are determined in response to the value of the amplitude control signal and/or the value of the phase control signal. Thus, it is apparent from the description that the amplitude and/or phase relationship between the input signal and the first feed forward signal can be changed in a preferred manner simply by adding the temperature compensation signal and adjustment signal to the control signals, namely, by simple means such as an adder.

The control circuit according to a second configuration of the present invention is a circuit which controls the amplifier having the above-described configuration and comprises the following:
(f) distortion detection control means for generating the first amplitude control signal and/or the first phase control signal so as to make the second feed forward signal a signal substantially containing only the distortion element contained in the output of the main amplifier;
(g) distortion elimination control means for generating the second amplitude control signal and/or the second phase control signal so as to substantially eliminate the distortion element from the output signal; and
(h) adding means for adding an amplitude offset signal and/or a phase offset signal to the second amplitude control signal and/or the second phase control signal.

This configuration also provides a similar advantage to that of the first configuration described above. Specifically, the amplitude and/or phase relationship between the output of the main amplifier and the second feed forward signal changes in response to the value of the amplitude offset signal and/or the value of the phase offset signal. If the amplitude offset signal and/or the phase offset signal is a temperature compensation signal, the amplitude and/or phase relationship between the output of the main amplifier and the second feed forward signal changes in response to temperature changes; if the signal is an adjustment signal, the relationship changes in response to how the initial adjustment is made. These also show that the invention enables temperature compensation to be made by an easy technique and simplifies initial adjustment work.

For example, variable attenuators and variable phase shifters are also available as actual means that may be used to change the amplitude and/or phase relationship between the output of the main amplifier and the second feed forward signal. Needless to say, the amounts of attenuation and phase shift of the variable attenuator and/or variable phase shifter are determined in response to the value of the second amplitude control signal and/or the value of the second phase control signal. Thus, it is apparent from the description that the amplitude and/or phase relationship between the output of the main amplifier and the second feed forward signal can be changed in a preferred manner simply by adding the temperature compensation signal and adjustment signal to the control signals, namely, by simple means such as an adder.

Of course, the first and the second configurations may be combined. The means for generating the second feed forward signal can be configured so as to contain a directional coupler which couples the output of the main amplifier to the first feed forward signal to generate the second feed forward signal. The output signal generating means can also be configured so as to contain a directional coupler which couples the output of the main amplifier to the second feed forward signal to generate an output signal. An auxiliary amplifier which amplifies the second feed forward signal may also be provided.

Further, the invention is not limited to the above-mentioned control circuit. For example, also included in the invention is an amplifier which has the function of the control circuit as well. The amplifier of the first configuration of the invention comprises the following:
(a) a main amplifier which amplifies an input signal;
(b) means for coupling output of the main amplifier to a first feed forward signal for generating a second feed forward signal;
(c) means for coupling output of the main amplifier to the second feed forward signal for generating an output signal;
(d) first adjustment means responsive to a first amplitude control signal and/or a first phase control signal for adjusting the relationship of amplitude and/or phase between the input signal and the first feed forward signal;
(e) second adjustment means responsive to a second amplitude control signal and/or a second phase control signal for adjusting the relationship of amplitude and/or phase between the output of the main amplifier and the second feed forward signal.
(f) distortion detection control means for generating the first amplitude control signal and/or the first phase control signal so as to make the second feed forward signal a signal substantially containing only the distortion element contained in the output of the main amplifier;
(g) distortion elimination control means for generating the second amplitude control signal and/or the second phase control signal so as to substantially eliminate the distortion element from the output signal; and
(h) adding means for adding a first amplitude offset signal and/or a first phase offset signal to the first amplitude control signal and/or the first phase control signal.

The amplifier of the second configuration of the invention comprises the following:
(a) a main amplifier which amplifies an input signal;
(b) means for coupling output of the main amplifier to a first feed forward signal for generating a second feed forward signal;
(c) means for coupling output of the main amplifier to the second feed forward signal for generating an output signal;
(d) first adjustment means responsive to a first amplitude control signal and/or a first phase control signal for adjusting the relationship of amplitude and/or phase between the input signal and the first feed forward signal;
(e) second adjustment means responsive to a second amplitude control signal and/or a second phase control signal for adjusting the relationship of amplitude and/or phase between the output of the main amplifier and the second feed forward signal.
(f) distortion detection control means for generating the first amplitude control signal and/or the first phase control signal so as to make the second feed forward signal a signal containing only the distortion element contained in the output of the main amplifier;
(g) distortion elimination control means for generating the second amplitude control signal and/or the second phase control signal so as to eliminate the distortion element from the output signal; and
(h) adding means for adding an amplitude offset signal and/or a phase offset signal to the second amplitude control signal and/or the second phase control signal.

Of course, these configurations may be combined.

BRIEF DESCRIPTION OF THE DRAWINGS

In the accompanying drawings.

PREFERRED EMBODIMENT

Figure 3:
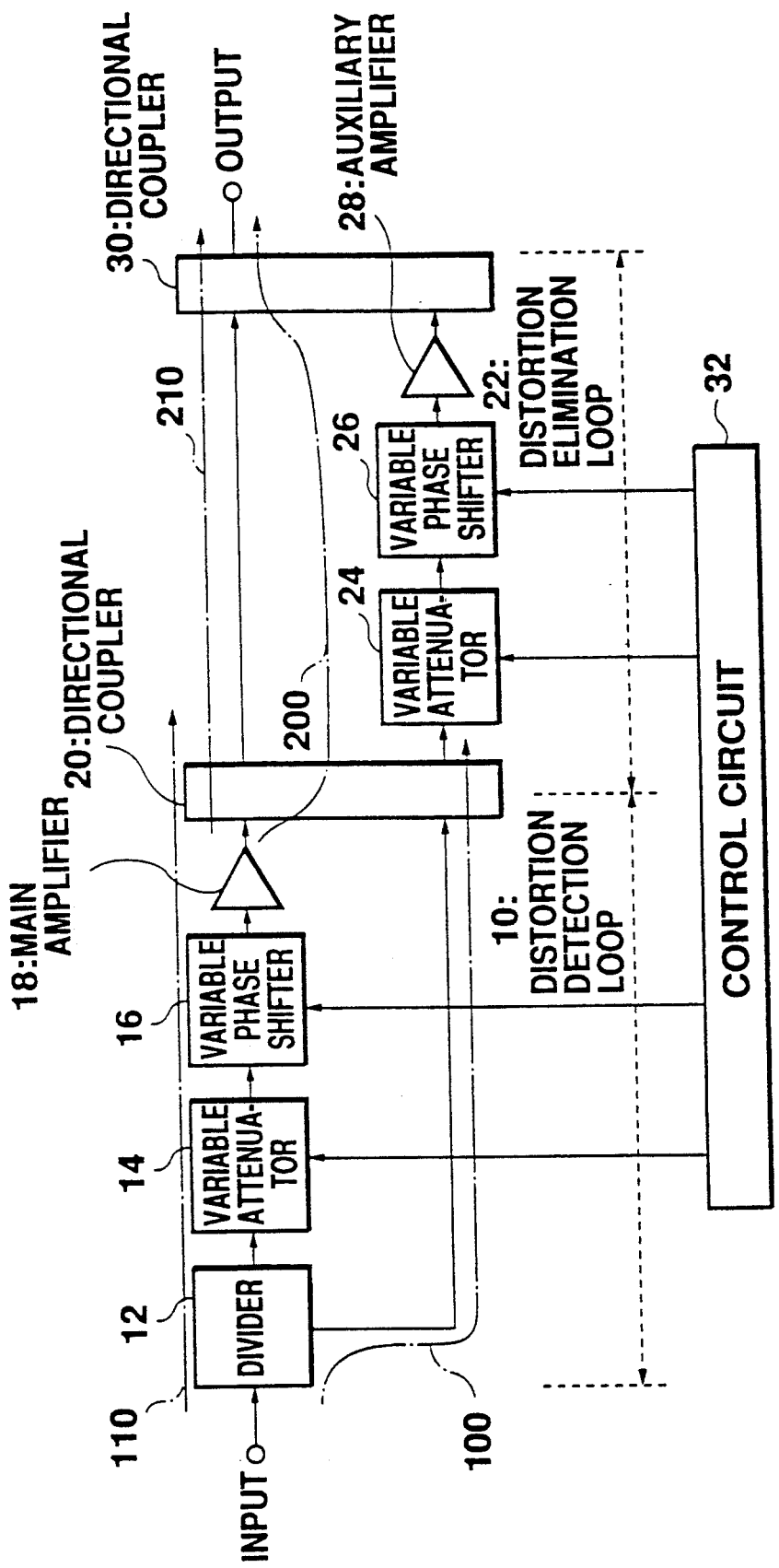
FIG. 3 is a block diagram showing a configuration example of a conventional FF circuit.
Figure 4:
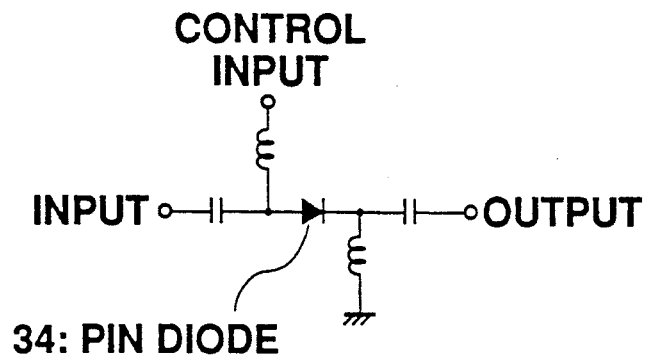
FIG. 4 is a circuit diagram showing a configuration example of a variable attenuator.
Figure 5:
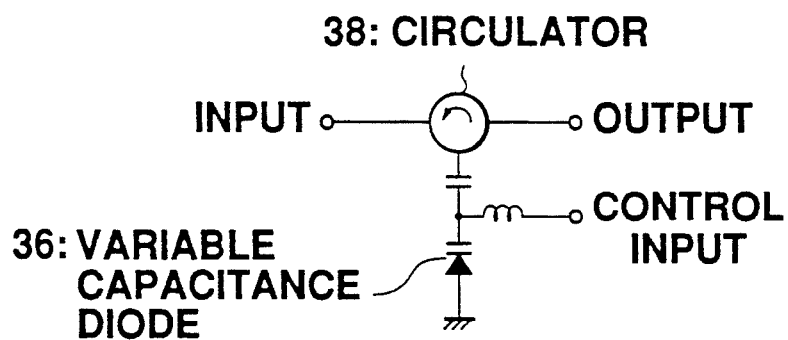
FIG. 5 is a circuit diagram showing a configuration example of a variable phase shifter.

Referring now to the accompanying drawings, there is shown a preferred embodiment of the invention. The similar parts to those shown in FIGS. 3-5 are designated by the same reference numerals in FIGS. 1 and 2, and description is omitted.

Figure 1:
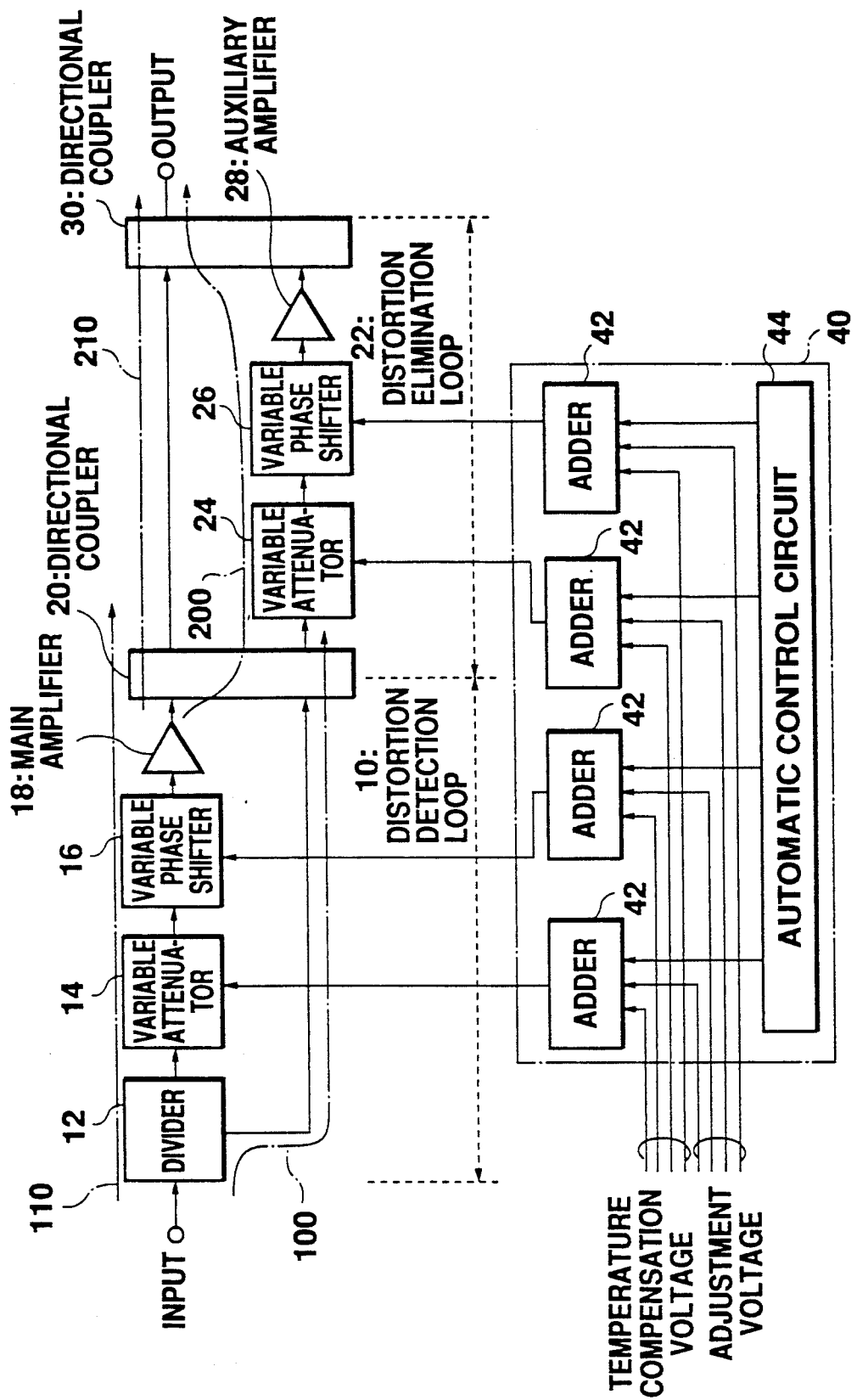
FIG. 1 is a block diagram showing the configuration of an FF amplifier according to one embodiment of the invention.

FIG. 1 shows the configuration of an FF amplifier according to one embodiment of the invention, wherein a control circuit 40 consists of four adders 42 and an automatic control circuit 44. Supplied to the control circuit 40 are a temperature compensation voltage output from a thermosensitive device (not shown) and an adjustment voltage adjusted by an engineer. The automatic control circuit 44 feeds a control voltage to the adders 42. Each adder 42 adds the temperature compensation voltage and adjustment voltage to the control voltage and outputs the resultant voltage to a variable attenuator 14 or 24 or a variable phase shifter 16 or 26 corresponding thereto.

Figure 2:
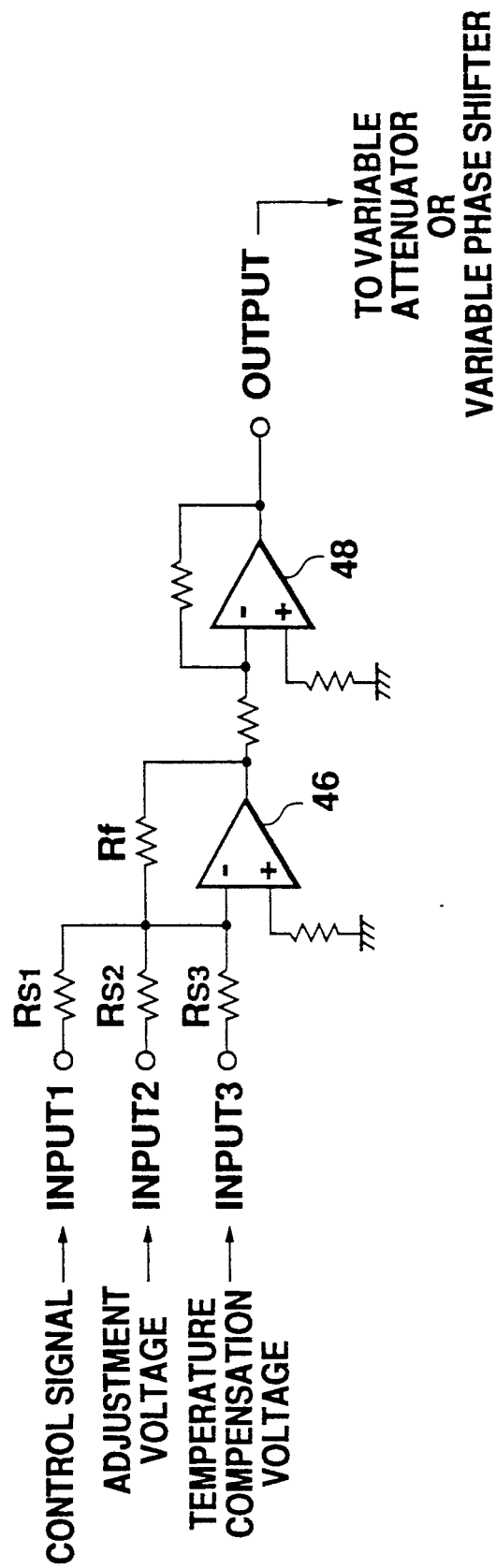
FIG. 2 is a circuit diagram showing the configuration of an adder according to the feature of the embodiment.

FIG. 2 shows a configuration example of the adder 42, wherein the adder 42 is made up of two connected stages of operational amplifiers 46 and 48. The control signal from the automatic control circuit 44, the adjustment voltage, and the temperature compensation voltage from the thermosensitive device are input to the operational amplifier 46 at the preceding stage via resistors $R_{S1}$, $R_{S2}$, and $R_{S3}$. Output of the operational amplifier 48 at the following stage is fed into one of the variable attenuators 14 and 24 and the variable phase shifters 16 and 26. For example, if the circuit in FIG. 2 is used as the leftmost adder 42 in FIG. 1, the output of the operational amplifier 48 is fed into the variable attenuator 14. The attenuation amount and phase of the signal relative to a main amplifier 18 or an auxiliary amplifier 28 are controlled.

That is, in the embodiment, control of the variable attenuators 14 and 24 and the variable phase shifters 16 and 26 is executed according to the voltage resulting from adding the control signal, adjustment voltage and temperature compensation voltage.

In the embodiment, the control ranges of the variable attenuators 14 and 24 and the variable phase shifters 16 and 26 are preset widely. The adjustment voltage and temperature compensation voltage are set so that complete distortion compensation operation can always be performed in a free running condition with no automatic control. This quickens leading-in operation, when automatic control is started, and stabilizes control operation. Since temperature compensation is always made by the adders 42, the best condition can be kept even in the free running condition.

Further, the input terminals of the adder 42 shown in FIG. 2 are isolated from each other, thus the control signal, adjustment voltage, temperature compensation voltage, etc., can be adjusted separately and one adjustment does not affect others. For example, if temperature compensation is not required, the input terminal for the temperature compensation voltage should be left unconnected or if automatic control is not required, the control signal input terminal should be left unconnected. To adjust the adjustment voltage in a free running condition, the control signal input terminal should be left unconnected.

Thus, according to the embodiment, temperature compensation is always executed by the adders 42 and the best condition is kept even in a free running condition, thus eliminating the need for variable attenuators and variable phase shifters for loop adjustment to execute the best distortion compensation operation in a free running condition, thus simplifying the circuit configuration. Further, the control range, adjustment range, temperature compensation coefficient, etc., can be changed by changing gains for each input of the adders 42, that is, by changing the ratio of resistors $R_{S1}$, $R_{S2}$, and $R_{S3}$ VS $R_f$. Even if the change ranges of the variable attenuators 14 and 24 and the variable phase shifters 16 and 26 are widened, the automatic control range can be set narrower to the minimum necessity, and resolution per bit, when a digital-to-analog converter is used at the output stage of the automatic control circuit 44, can be made fine. Variable attenuators of the configuration shown in FIG. 4 should be used as the variable attenuators 14 and 24, and the variable phase shifters of the configuration shown in FIG. 5 should be used as the variable phase shifters 16 and 26.

As described above, the control circuit or FF amplifier of the invention enables stable control operation to be performed in a simpler configuration and easy FF amplifier adjustment to be made. That is, temperature compensation can be executed by a simple technique and with a small number of parts and preferred FF control can be performed.

What is claimed is:

1. A control circuit used to control an amplifier, wherein the amplifier comprises a main amplifier amplifying an input signal, first coupling means for coupling an output of said main amplifier to a first feed forward signal and for generating a second feed forward signal, second coupling means for coupling the output of said main amplifier to said second feed forward signal and for generating an output signal, first adjustment means for adjusting a relationship of at least one of an amplitude and a phase between said input signal and said first feed forward signal, and second adjustment means for adjusting a relationship of at least one of an amplitude control signal for adjusting a relationship of at least one of an amplitude and a phase between the output of said main amplifier and said second feed forward signal, said first adjustment means responsive to at least one of a first amplitude control signal and a first phase control signal, said second adjustment means responsive to at least one of a second amplitude control signal and a second phase control signal, said control circuit comprising:

(a) distortion detection control means for generating at least one of said first amplitude control signal and said first phase control signal to make said second feed forward signal substantially contain only a distortion element, the distortion element contained in the output of the main amplifier;

(b) distortion elimination control means for generating at least one of said second amplitude control signal and said second phase control signal to substantially eliminate the distortion element from said output signal; and (c) first adding means for adding at least one of a first amplitude offset signal to said first amplitude control signal and a first phase offset signal to said first phase control signal.

2. The control circuit of claim 1, wherein said first adjustment means includes a variable attenuator responsive to said first amplitude control signal, said variable attenuator attenuating said input signal, 3. The control circuit of claim 1, wherein said first adding means includes an adder adding said first amplitude offset signal to said first amplitude control signal, 4. The control circuit of claim 1, wherein said first amplitude offset signal is a temperature compensation signal corresponding to changes in temperature.

5. The control circuit of claim 1, wherein said first amplitude offset signal is an adjustment signal set at an initial adjustment.

6. The control circuit of claim 1, wherein said first adjustment means includes a variable phase shifter responsive to said first phase control signal, the variable phase shifter shifting a phase of said input signal.

7. The control circuit of claim 1, wherein said first adding means includes an adder adding said first phase offset signal to said first phase control signal.

8. The control circuit of claim 1, wherein said first phase offset signal is a temperature compensation signal corresponding to changes in temperature.

9. The control circuit of claim 1, wherein said first phase offset signal is an adjustment signal set at an initial adjustment.

10. The control circuit of claim 1, wherein said second adjustment means includes a variable phase shifter responsive to said second phase control signal, the variable phase shifter, shifting a phase of said input signal.

11. The control circuit of claim 1, wherein said second adjustment means includes a variable attenuator responsive to said second amplitude control signal, the variable attenuator attenuating said input signal.

12. The control circuit of claim 1, further comprising:
second adding means for adding at least one of a second amplitude offset signal to the second amplitude control signal and a second phase offset signal to said second phase control signal.

13. The control circuit of claim 12, wherein said first adding means includes an adder adding said second amplitude offset signal to said second amplitude control signal.

14. The control circuit of claim 12, wherein said second amplitude offset signal is a temperature compensation signal corresponding to changes in temperature.

15. The control circuit of claim 12, wherein said second amplitude offset signal is an adjustment signal set at initial adjustment.

16. The control circuit of claim 12, wherein said second adding means includes an adder adding said second phase offset signal to said first phase control signal.

17. The control circuit of claim 12, wherein said second phase offset signal is a temperature compensation signal corresponding to changes in temperature.

18. The control circuit of claim 12, wherein said second phase offset signal is an adjustment signal set at an initial adjustment.

19. The control circuit of claim 1, wherein said first coupling means includes a directional coupler coupling the output of said main amplifier to the first feed forward signal, the directional coupler generating the second feed forward signal.

20. The control circuit of claim 1, wherein said second adjustment means includes a directional coupler coupling the output of said main amplifier to the second feed forward signal, the directional coupler generating the output signal.

21. The control circuit of claim 1, further comprising an auxiliary amplifier amplifying the second feed forward signal.

22. A control circuit used to control an amplifier, wherein the amplifier comprises a main amplifier amplifying an input signal, first coupling means for coupling an output of said main amplifier to a first feed forward signal and for generating a second feed forward signal, second coupling means for coupling the output of said main amplifier to said second feed forward signal and for generating an output signal, first adjustment means for adjusting a relationship of at least one of an amplitude and a phase between said input signal and said first feed forward signal, and second adjustment means for adjusting a relationship of at least one of an amplitude and a phase between the output of said main amplifier and said second feed forward signal, the first adjustment means responsive to at least one of a first amplitude control signal and a first phase control signal, the second adjustment means responsive to at least one of a second amplitude control signal and a second phase control signal, said control circuit comprising:

(a) distortion detection control means for generating at least one of said first amplitude control signal and said first phase control signal to make said second feed forward signal contain only a distortion element, the distortion element contained in the output of the main amplifier;

(b) distortion elimination control means for generating at least one of said second amplitude control signal and said second phase control signal to eliminate the distortion element from said output signal; and (c) adding means for adding at least one of an amplitude offsets signal to said second amplitude control signal and a phase offset signal to said second phase control signal.

23. An amplifier comprising:
(a) a main amplifier amplifying an input signal;
(b) first coupling means for coupling an output of said main amplifier to a first feed forward signal and for generating a second feed forward signal;
(c) second coupling means for coupling the output of said main amplifier to said second feed forward signal and for generating an output signal;
(d) first adjustment means for adjusting a relationship of at least one of an amplitude and a phase between said input signal and said first feed forward signal, the first adjustment means responsive to at least one of a first amplitude control signal and a first phase control signal.
(e) second adjustment means for adjusting a relationship of at least one of an amplitude and a phase between the output of said main amplifier and said second feed forward signal, the second adjustment means responsive to at least one of a second amplitude control signal and a second phase control signal;
(f) distortion detection control means for generating at least one of said first amplitude control signal and said first phase control signal to make said second feed forward signal substantially contain only a distortion element, the distortion element contained in the output of the main amplifier;
(g) distortion removal control means for generating at least one of said second amplitude control signal and said second phase control signal to substantially remove the distortion element from said output signal; and
(h) first adding means for adding at least one of a first amplitude offset signal to said first amplitude control signal and a first phase offset signal to said first phase control signal.

24. The amplifier of claim 23, further comprising:
second adding means for adding at least one of a second amplitude offset signal to said second amplitude control signal and a second phase offset signal to said second phase control signal.

25. An amplifier comprising:
(a) a main amplifier amplifying an input signal;
(b) first coupling means for coupling an output of said main amplifier to a first feed forward signal and for generating a second feed forward signal;

(c) second coupling means for coupling the output of said main amplifier to said second feed forward signal and for generating an output signal;

(d) first adjustment means for adjusting a relationship of at least one of an amplitude and a phase between said input signal and said first feed forward signal, the first adjustment means responsive to at least one of a first amplitude control signal and a first phase control signal;

(e) second adjustment means for adjusting a relationship of at least one of an amplitude and a phase between the output of said main amplifier and said second feed forward signal, the second adjustment means responsive to at least one of a second amplitude control signal and a second phase control signal;

(f) distortion detection control means for generating at least one of said first amplitude control signal and said first phase control signal to make said second feed forward signal contain only a distortion element, the distortion element contained in the output of the main amplifier;

(g) distortion removal control means for generating at least one of said second amplitude control signal and said second phase control signal to remove the distortion element from said output signal; and (h) adding means for adding at least one of an amplitude offset signal to said second amplitude control signal and a phase offset signal to said second phase control signal.

* * * * *